United States Patent [19]

Ammon et al.

[11] Patent Number: 4,851,628
[45] Date of Patent: Jul. 25, 1989

[54] METHOD FOR THE CRUCIBLE-FREE FLOATING ZONE PULLING OF SEMICONDUCTOR RODS AND AN INDUCTION HEATING COIL THEREFOR

[75] Inventors: Wilfried V. Ammon; Wolfgang Hensel, both of Burghausen; Heinz Klinger, Altötting, all of Fed. Rep. of Germany

[73] Assignee: Wacker-ChemiTronic Gesellschaft fur Elektronik-Grundstoffe mbH, Munich, Fed. Rep. of Germany

[21] Appl. No.: 281,499

[22] Filed: Dec. 8, 1988

[30] Foreign Application Priority Data

Feb. 18, 1988 [DE] Fed. Rep. of Germany ....... 3805118

[51] Int. Cl.$^4$ .......................... H05B 6/44; C30B 15/14
[52] U.S. Cl. .............................. 219/10.43; 219/10.79; 156/620.73; 336/232
[58] Field of Search ............... 219/10.43, 10.41, 10.79, 219/10.57, 10.67; 373/139; 156/604, 620.7, 620.72, 620.73; 336/232, 223

[56] References Cited

U.S. PATENT DOCUMENTS

| | | | |
|---|---|---|---|
| 3,096,158 | 7/1963 | Gaulé et al. | 219/10.43 |
| 3,601,569 | 8/1971 | Keller | 219/10.43 |
| 4,749,837 | 6/1988 | von Ammon et al. | 219/10.79 |
| 4,797,525 | 1/1989 | Keller | 219/10.79 |

FOREIGN PATENT DOCUMENTS 1230726  5/1971  United Kingdom ............. 219/10.79

Primary Examiner—Philip H. Leung
Attorney, Agent, or Firm—Collard, Roe & Galgano

[57] ABSTRACT

A method for pulling silicon semiconductor rods, in particular having diameters of 10cm and over. The current methods of crucible-free float zoning or float zone pulling can be markedly improved if the molten cap like zone which develops is forced inwardly in the growth process. This is accomplished with the aid of electromagnetic forces in an annular zone situated opposite the coil slot. The electromagnetic forces can be achieved by using induction heating coils whose coil surface facing the molten cap is provided with annular segments whose thickness increases from their inner periphery outwardly and which are disposed opposite the coil slot above the peripheral region of the molten cap.

11 Claims, 1 Drawing Sheet

METHOD FOR THE CRUCIBLE-FREE FLOATING ZONE PULLING OF SEMICONDUCTOR RODS AND AN INDUCTION HEATING COIL THEREFOR

BACKGROUND OF THE INVENTION

1. Field of the Invention

The invention relates to a method for the crucible-free float zoning or floating zone pulling of semiconductor rods. More particularly, it relates to a method in which a feed or supply rod is converted into a crystal rod having a molten zone which overlays the crystallization front like a cap, which cap is produced by means of a circular induction heating coil while the crystal rod is subjected to a rotary movement. An induction heating coil having coil ends which are separated from each other by a coil slot is disclosed for carrying out the method.

2. Description of the Prior Art

The production of dislocation-free monocrystalline semiconductor rods with the aid of the method of crucible-free floating zone pulling or float zoning is well known. In addition, numerous induction heating coils which can be used in such methods are known such as that disclosed in U.S. Pat. No. 4,749,837. In most of these methods, a feed rod, which is, as a rule, polycrystalline and is composed, for example, of high-purity silicon obtained by gas-phase deposition is clamped vertically in a receiving container. The receiving container allows a working atmosphere of a particular composition to be established. The rod is melted starting from its lower end by means of an induction heating coil which concentrically surrounds the molten zone. As an option, the rod may be rotated during this melting procedure.

The product rod is usually also rotated and is, as a rule, monocrystalline. It is covered at its upper end in a cap-like manner by molten material and is situated underneath the coil and grows as a result of the progressive crystallization of the material. Such methods are explained, in principle, for example in W. Dietze, W. Keller and A. Muhlbauer, "Float Zone Grown Silicon" in *Crystals*, Volume 5 (1981), Springer-Verlag, Berlin-Heidelberg-New York. The known pulling methods reach their useful limit when the production of crystalline rods having large diameters, i.e., 10-15 cm and over is required. Such large diameters are being used with increasing frequency in the production of electronic or power components. It has been found that with such rod diameters, some problems which are negligible in pulling smaller rods become increasingly important.

These problems are frequently associated with the fact that the molten cap overlaying the product rod contains a correspondingly larger amount of molten material which also requires a correspondingly higher power to produce. For example, because of the non-homogeneity of the high-frequency field produced by the conventional coil geometries, irregular melting and crystallization behavior is produced. Thus, melt-backs frequently occur in the region of the coil slot and the rods produced have a tendency to exhibit "egg formation", i.e. acentric growth due to the irregular development of the molten cap. These rods also exhibit radial variations in the distribution of dopant. This undesirable effect becomes perceptible even with smaller rod diameters. The pulling of satisfactory rods, in particular with diameters of 10 cm and over, with satisfactory and economically acceptable yields is therefore not possible with the conventional pulling methods even when they are utilized with great care.

SUMMARY OF THE INVENTION

It is an object of the invention to provide a reliable high yield method for crucible-free floating zone pulling of semiconductor rods.

It is another object of the invention to provide a method and induction heating coil therefor which permits the production of satisfactory rods having in particular, diameters of 10 cm and over, without unacceptably increasing equipment costs over that of conventional methods.

Accordingly, these and related objects are achieved by a method which comprises forcing a molten cap formed on the product duct rod inwardly in the peripheral region with the aid of electromagnetic forces developed in an annular region which encompasses $\frac{3}{4}$ or less of the rod circumference and which is situated opposite a slot in the induction coil.

Induction heating coils for carrying out this method have a flat bottom surface facing the molten cap and contain one or more annular segments of radially outwardly increasing thickness. These annular segments protrude from the bottom surface of the coil and encompass the molten cap above the peripheral region thereof and are disposed within a sector situated opposite the coil slot and occupy up to $\frac{3}{4}$ of the coil or coil central hole circumference.

These and other objects and advantages of the present invention will become apparent from the following description of the accompanying drawing, which discloses one embodiment of the invention. It is to be understood that the drawing is to be used for the purpose of illustration only, and not as a definition of the invention.

BRIEF DESCRIPTION OF THE DRAWING

In the drawing, wherein similar reference numerals denote similar elements throughout the several views.

DESCRIPTION OF THE PREFERRED EMBODIMENT

Figure 1:
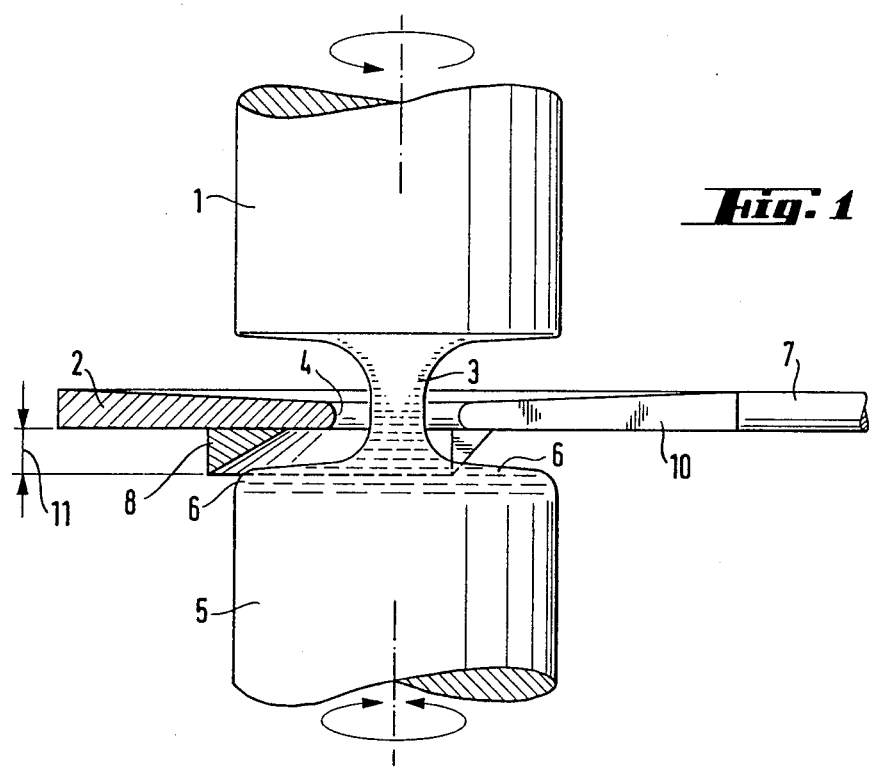
FIG. 1 is a diagrammatic cross-sectional view of an embodiment for pulling semiconductor rods with an induction heating coil of the present invention.
Figure 2:
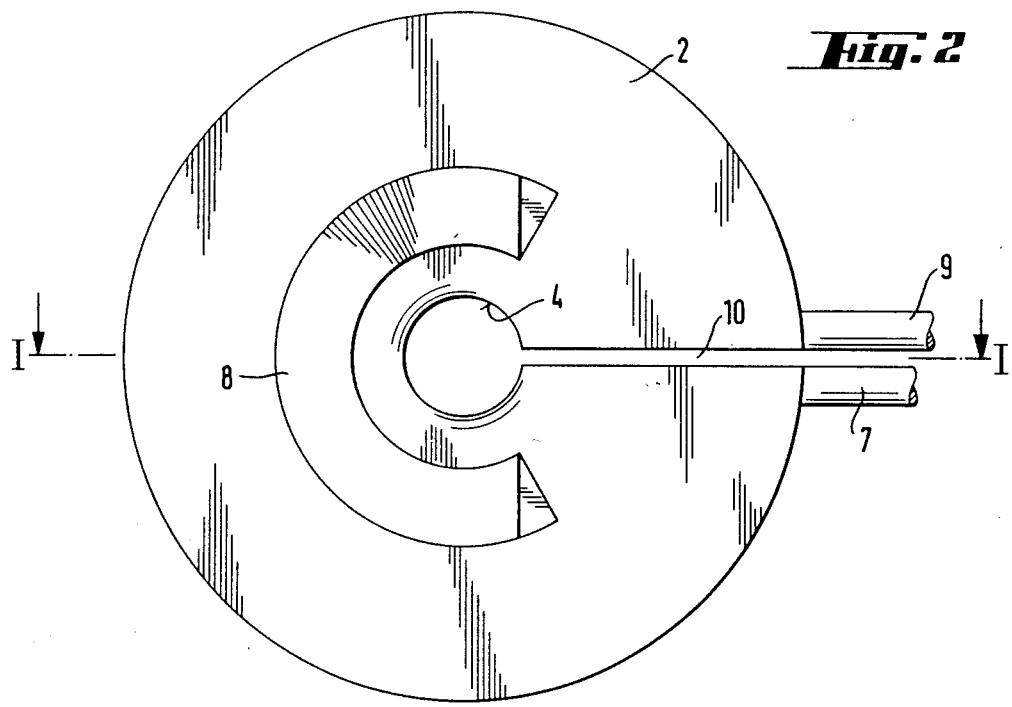
FIG. 2 is a plan view of a lower side of the coil of FIG. 1.

Referring to FIGS. 1 and 2, there is shown a first semi-conductor feed rod 1 which is composed, for example, of poly-crystalline high purity silicon obtained by gas-phase deposition and which as a rule rotates around its longitudinal axis during the growth process. The lower side of rod 1 is melted with the aid of an induction heating coil, having a coil body 2. The molten material passes through the central coil opening 4 in a narrow molten column 3 and overlies the second semi-conductor product rod 5, for example, a monocrystalline silicon rod, to form a convex molten cap 6. Induction heating coil body 2 is supplied with the required power via the supply and ground conductors 7 and 9. Coil body 2 has an annular segment 8 attached to the bottom surface thereof having, for example, a wedge-shaped cross-section. Annular segment 8 is disposed within a sector situated opposite coil slot 10 and surrounds about $\frac{2}{3}$ of the circumference of coil opening 4.

Annular segment 8 extends over the peripheral region of molten cap 6 in this sector.

Annular segment 8, which may also be in the form of two or more individual segments separated by gaps, produces in the surrounding region an electromagnetic field structure emanating from coil body 2. This structure forces the molten cap inwardly in the peripheral region opposite coil slot 10 which is the region with the highest field strength. This inwardly directed force effect becomes more pronounced the nearer the melt approaches annular segment 8, i.e., the more the molten cap bulges radially outwardly. Thus, the system automatically establishes a final optimum position of the molten cap in which the forces acting radially on the melt are considerably more uniform compared with conventional coils.

Referring to FIG. 2, there is shown the bottom surface of the coil with the supply and ground conductors 7 and 9, respectively. Coil slot 10 extends between the coil ends, and merges with central coil opening 4. Annular segment 8, which, in the present case has, for example, a wedge-shaped cross-section, is situated opposite coil slot 10 within a sector corresponding to about ⅔ of the circumference of central coil opening 4. The size of this sector may, however, be varied; coils in which the segment is disposed within a sector corresponding to ¼ to ¾ of the coil circumference, have proven effective. This also applies where segment 8 is composed of several individual segments between which, for example, supply lines for dopant or ground connections can be routed. For the sake of simplicity only a single annular segment 8 will be discussed below, however, the statements made apply analogously to such groups of individual segments.

The inside and outside radius of annular segment 8 is chosen in accordance with the radius of the product rod. Advantageously, the inside radius is equivalent to no less than 0.5 times this value and the outside radius to no more than 1.5 times this value. It is also desirable that the difference between the outside and inside radius is no less than 0.1 times, preferably 0.3 to 0.8 times, the rod radius. The height 11 with which annular segment 8 projects at its outside circumference below the actual bottom surface of the coil is periferably 0.1 to 2 times the maximum coil thickness.

Advantageously, the surface of segment 8 facing the molten cap 6 is flat, with an inclination with respect to the rod axis being preferably 50°–80°, in particular 60°–70°, i.e., in the form of the outside surface of a truncated cone, so that segment 8 ultimately has a wedge-shaped cross-section. Optionally, this surface may, however, also be in the form of a concave or convex arch.

It is desirable to use the same material for segment 8 as is used to manufacture coil body 2. This material is pri-marily silver, copper or silver-plated metals from which the induction heating coils are usually manufactured. In most cases, coil body 2 and segment 8 will first be produced separately and then joined to each other, for example, by welding. In this manner, conventional coils with a flat bottom may subsequently be coupled to such a segment. It is also possible, however, to manufacture the parent coil body and the segment from a single workpiece. In addition, the invention is not restricted to the single-winding coil shown in the figures for reasons of clarity, but can just as well be used with multiple-winding coils.

The actual method for pulling rods can be carried out in the known manner described, for example, in the Dietze et al article mentioned above, in relation to parameters of the method such as rod rotation, working atomosphere or feed rod prepara-tion. Particularly good results, however, are achieved if the rotation of the product rod is carried out by alternating the direction of rotation. This applies, in particular, in relation to an improved radial dopant distribution, even for rod diameters of 7.5 cm and over. It has proven advantageous, in that case, to change the direction of rotation after every 0.1 to 20 rotations of the product rod. Particularly beneficial is varying the reversal so that the point of reversal is statistically distributed over the circumference of the rod in the course of the growth process. In principle, however, other variations of the method can be used with rod rotation in the same direction, rod rotation with changing speed or even periodic stopping.

The induction heating coil of the present invention, in particular in conjunction with the pulling method using an alternating direction of rotation of the product rod, markedly reduces, especially with large rod diameters of approximately 10 cm and over, many of the disadvantages of the prior art. Specifically, the disadvantages caused by the nonhomogeneity of the field in the coil slot, such as melt-backs, "egg formation" of the rod or radial dopant variations are eliminated since the molten cap is forced inwardly by the electromagnetic forces and its harmful outward bulges can be prevented. Even with rods having smaller rod diameters of approximately 7.5–10 cm, which are less critical from the point of view of growth behavior, the radial distribution of the dopants becomes markedly more uniform. Ultimately, therefore, the pulling behavior of the rods is improved during crucible-free floating zone pulling and the yield of satisfactory rods is consequently increased and/or their quality raised.

The invention will now be described in further detail with reference being made to the following examples. It should, however, be recognized that the examples are given as being illustrative of the present invention and are not intended to limit the spirit and scope thereof.

EXAMPLE 1

A silicon monocrystal (diameter approximately 7.5 cm [111]orientation, growth rate approximately 2.5 mm/min) was grown under the conventional growth conditions in a standard zone pulling installation (see, on this point, for example, W. Keller and A. Muhlbauer, "Floating-Zone Silicon", Marcel Dekker, Inc., New York and Basel, (1981), pages 44–65). The receiving container was pressurized with argon to about 2 bar; the silicon was phosphorus-doped (specific resistance approximately 3 ohm cm). The diameter of the polycrystalline feed rod was approximately 7.5 cm.

A single-winding flat coil turned from solid silver which had a milled cooling channel, an inner hole diameter of approximately 36 mm and an outer diameter of about 170 mm was used as induction heating coil. An annular segment having a cross-section increasing outwardly in a wedge shape was incorporated on the flat bottom surface of the coil in a sector situated opposite the coil slot and occupying approximately 2/3 of the coil circumference. At approximately 30 mm, the inside radius of the segment was equivalent to about 0.8 times the radius of the product rod, while at approximately 45 mm, the outside radius was about 1.2 times this radius. At its outside edge, the segment extended approximately 0.6 cm below the actual bottom surface of the coil, equivalent to about 0.5 times the maximum coil thickness.

During the growth process, the feed rod was subjected to a constant rotation at a speed of 1 rpm, while the product rod executed a rotation cycle with alternating direction of rotation. During this process, the product rod was first rotated for 7 seconds with a maximum speed of 16 rpm in the opposite direction to the feed rod, stopped, rotated for a further 7 seconds with 18 rpm maximum speed along with the feed rod, stopped again, rotated for 7 seconds with a 15 rpm maximum speed with the direction of rotation reversed, and finally subjected to a further counterrotation with a 17 rpm maximum speed and 7 second duration. This cycle was again repeated from the beginning and a statistical distribution of the reversal point over the circumference of the rod was consequently achieved in the course of the growth process. The growth process was terminated with a rod length of 1000 mm and the rod obtained was removed.

Subsequently, the rod was sawn up into wafers approximately 350 $\mu$m thick by means of an annular-hole saw. The order of magnitude of the radial variations in resistance, from which the radial variations of dopant distribution can be inferred, were now determined for nine (9) wafers at intervals of 10 cm each. The radial variations in resistance is an important criterion of the quality of the material obtained. This determination was carried out on the basis of the profile of the spreading resistance determined in accordance with ASTM specification F525 (1977) with the aid of the "spreading resistance" method (cf., on this point, for example, W. Dietze, Keller and A. Muhlbauer, "Float-Zone Grown Silicon" in Crystals, Growth, Properties and applications, Vol. 5, pages 34–36, Springer-Veraag, Berlin, Heidelberg (1981)). From the profiles determined, it was possible to see that the resistance did not vary by more than 20% around the respective mean value in any wafer.

In a comparision experiment, a second rod was grown under precisely the same conditions with one difference. Instead of using the induction heating coil of the present invention, a coil was used which had a completely flat bottom but with otherwise identical dimensions. Because the coil used had a flat bottom with no annular segments having an outwardly increasing thickness, the molten cap was not forced inwardly in the cap region with the aid of electromagnetic forces. The rod obtained was also sawn up into wafers. Nine (9) of these wafers were removed from the same positions and measured. In each of them, the spreading resistance determined varied upwardly and downwardly by up to 30% around the respective mean value.

EXAMPLE 2

A commercial floating zone pulling installation was equipped with a single-winding induction heating coil (inside hole radius approximately 20 mm, outside radius approximately 90 mm, material silver, maximum coil thickness approximately 15 mm.) An annularly encompassing segment having a thickness increasing outwardly from its inner diameter in a wedge shape was welded to the flat bottom side of the coil. The segment was welded concentrically with the coil hole in a sector situated opposite the coil slot and comprising approximately 3/5 of the coil circumference. The inside radius of this segment was 45 mm, the outside radius 75 mm, and the thickness at the outside of the wedge shape was 10 mm. Therefore, the surface of the segment facing the molten cap enclosed an angle of approximately 71° with respect to the rod axis.

A monocrystalline silicon rod having approximately 12.5 cm diameter was now grown in this installation from a polycrystalline feed rod having approximately a 12.5 cm diameter. During this process, the feed rod was rotated at approximately 1 rpm while the rotation of the product rod followed a cycle with reversing directions of rotation similar to the procedure described in Example 1. The rod exhibited a satisfactory growth behavior during the entire growth process and no melt-backs and/or overhangs could be detected in the region of the molten cap. The growth process was terminated when the rod reached a length of 75 cm and the rod was removed.

In a comparison experiment, the growth process was repeated under the same conditions using a coil which was not provided with an annular segment having a wedge-shaped cross section on its flat bottom side but which was otherwise identical. Even with a rod length of 10 cm clear melt-backs occurred resulting in ever increasing overhangs of the molten cap. Upon solidification of the molten cap, overhangs occurred in the coil slot region which exhibited an ever greater deviation of the product rod from the concentric position. The growth process had to be discontinued at a rod length of approximately 20 cm.

While several embodiments and examples of the present invention have been described and/or shown, it is obvious that many changes and modifications may be made thereunto, without departing from the spirit and scope of the invention.

What is claimed is:

1. In a method for the crucible-free floating zone pulling of semiconductor rods of the type wherein a semiconductor feed rod is converted into a semiconductor product rod during the rotation thereof via a molten zone thereon which overlies the crystallization front like a cap by melting the feed rod with an induction heating coil having a central opening therein and having coil ends which are separated from each other by a coil slot, the improvement comprising:
    forcing the molten zone inwardly in a peripheral region thereof with the aid of electromagnetic forces in an annular zone which encompasses no more than three fourths of the semiconductor product rod circumference and which is disposed opposite the coil slot.

2. The method as set forth in claim 1, wherein said rotation of said semiconductor product rod is carried out by reversing the direction of rotation at predetermined intervals.

3. The method as set forth in claim 2, wherein the direction of rotation of said semiconductor product rod is reversed after 0.1 to 20 rotations thereof.

4. The method as claimed in claim 1, wherein the electromagnetic forces forcing said molten zone inwardly in the direction of said central opening of the induction heating coil are produced in a region surrounding $\frac{1}{4}$ to $\frac{3}{4}$ of said semiconductor product rod circumference.

5. An induction heating coil for the production of monocrystalline semiconductor rods comprising:
    a coil body having a generally flat portion of predetermined thickness, a central opening therein and coil ends separated from one another by a coil slot, and at least one annular segment depending from said coil body surrounding up to three fourths of the outer circumference of said central opening in said induction heating coil body disposed opposite the coil slot, said depending annular segment having a downwardly facing tapered surface, increasing in thickness from an inner peripheral edge thereof adjacent said central opening to an outer peripheral edge thereof.

6. The induction heating coil as set forth in claim 5, wherein said inner peripheral edge of said annular segment has a radius of no less than 0.5 times the radius of the product semiconductor rod and said outer peripheral edge has a radius of no more than 1.5 times said radius of the semiconductor product rod.

7. The induction heating coil as set forth in claim 6, wherein the difference between said inner and outer radius of said annular segment is equivalent to 0.3 to 0.8 times the radius of the semiconductor product rod.

8. The induction heating coil as set forth in claim 5, wherein said annular segment has a thickness at its outer peripheral edge, equivalent to 0.2 to 2 times the predetermined thickness of said flat portion of said coil body.

9. The induction heating coil as claimed in claim 5, wherein said at least one annular segment has a wedge-shaped cross-section.

10. The induction heating coil as set forth in claim 5, wherein the angle of said downwardly facing tapered surface of said annular segment forms an angle of 10° to 40° with respect to a bottom surface of said flat portion of said coil body.

11. The induction heating coil as set forth in claim 5, wherein said annular segment is formed integrally with said coil body.

* * * * *

UNITED STATES PATENT AND TRADEMARK OFFICE
CERTIFICATE OF CORRECTION

PATENT NO. : 4,851,628
DATED : JULY 25, 1989
INVENTOR(S) : AMMON ET AL

It is certified that error appears in the above-identified patent and that said Letters Patent is hereby corrected as shown below:

Cover page, item 73, delete "Wacker-ChemiTronic" and substitute therefor --Wacker-Chemitronic--.

Signed and Sealed this

Seventeenth Day of July, 1990

Attest:

HARRY F. MANBECK, JR.

*Attesting Officer*  *Commissioner of Patents and Trademarks*